(12) United States Patent
Lee

(10) Patent No.: US 7,166,484 B2
(45) Date of Patent: Jan. 23, 2007

(54) METHOD FOR FABRICATING IMAGE SENSOR WITH INORGANIC MICROLENS

(75) Inventor: Ju-Il Lee, Ichon-shi (KR)

(73) Assignee: Magnachip Semiconductor, Ltd. (KR)

( * ) Notice: Subject to any disclaimer, the term of this patent is extended or adjusted under 35 U.S.C. 154(b) by 214 days.

(21) Appl. No.: 10/877,317

(22) Filed: Jun. 25, 2004

(65) Prior Publication Data

US 2005/0130071 A1 Jun. 16, 2005

(30) Foreign Application Priority Data

Dec. 11, 2003 (KR) ............ 10-2003-0090203

(51) Int. Cl.
*H01L 21/00* (2006.01)
(52) U.S. Cl. .................. 438/29; 438/65; 438/69
(58) Field of Classification Search ........ 438/27, 438/29, 65, 66, 69, 70, 71
See application file for complete search history.

(56) References Cited

U.S. PATENT DOCUMENTS 5,877,040 A * 3/1999 Park et al. ............ 438/70
6,163,407 A * 12/2000 Okazaki et al. .......... 359/619
6,259,083 B1 * 7/2001 Kimura .............. 250/208.1
6,903,395 B1 * 6/2005 Nakai et al. ............ 257/294

FOREIGN PATENT DOCUMENTS

| JP | 11040787 A | * | 2/1999 |
| JP | 2000031442 A | * | 1/2000 |
| JP | 2002076316 A | * | 3/2002 |
| JP | 2003-051588 | | 2/2003 |

* cited by examiner

*Primary Examiner*—Kevin M. Picardat
(74) *Attorney, Agent, or Firm*—Blakely Sokoloff Taylor & Zafman

(57) ABSTRACT

The present invention relates to a method for fabricating an inorganic microlens. The method includes the steps of: depositing an inorganic layer on a substrate; forming a hemispherical photoresist pattern on the inorganic layer; and performing a blanket etch-back process to thereby form a hemispherical inorganic microlens.

9 Claims, 4 Drawing Sheets

METHOD FOR FABRICATING IMAGE SENSOR WITH INORGANIC MICROLENS

FIELD OF THE INVENTION

The present invention relates to a method for fabricating an image sensor; and, more particularly, to a method for fabricating an image sensor with an inorganic microlens for improving a light concentration degree of the image sensor.

DESCRIPTION OF RELATED ARTS

An image sensor is a device that converts the one dimensional or above the two dimensional optical information into an electric signal. The image sensor is classified into two types; they are, an image pickup tube and a solid image pickup device. The image pickup tube is widely used in fields related to measurement, control and recognition with adaptation of an image processing technology focused on television, and various applied technologies on the image pickup tube have been developed. A currently commercialized solid image pickup device of the image sensor is classified into a metal oxide semiconductor (MOS) type and a charge coupled device (CCD) type.

A complementary metal oxide semiconductor (CMOS) image sensor is a device that converts an optical image into an electric signal. Particularly, the CMOS image sensor adopts a switching mode that sequentially detects outputs with use of MOS transistors fabricated as the same number of pixels. Compared to a CCD image sensor, the CMOS image sensor is more convenient in its driving mode and is capable of realizing various scanning types. Also, the realization of a signal processing circuit into a single chip makes it possible to minimize the CMOS image sensor. Furthermore, the CMOS image sensor is advantageous in lowering power consumption and reducing manufacturing costs because of the use of a compatible CMOS technology.

In the image sensor, it is important to convert incident lights into electric signals without any loss. It is a photodiode that performs the above conversion function. However, in a unit pixel of a conventional image sensor, the photodiode is formed in a limited area since the unit pixel is complexly formed not only of the photodiode but also of circuits for processing signals generated within the unit pixel. To overcome this problem, a microlens is formed within an upper part of the unit pixel to condense lights incident to regions other than a photodiode region into the photodiode region. The use of the microlens improves a light concentration degree of the image sensor.

FIGS. 1 and 2 are diagrams showing a conventional method for fabricating a microlens.

Referring to FIG. 1, in a conventional CMOS image sensor, field oxide layers 102, photodiodes 103, an inter-metal insulation layer 104, metal wires 105 and a passivation layer 106 are sequentially formed on a silicon substrate 101. On top of this resulting structure, a first planarization layer 107, color filters 108 and a second planarization layer 109 are formed.

Next, an array of microlenses is formed on the second planarization layer 109. More specifically, an organic photoresist pattern 110 is formed on a region corresponding to each photodiode 103. Thereafter, a thermal process is performed.

Referring to FIG. 2, edges of the organic photoresist pattern 110 are susceptible to heat exerted by the thermal process, and thus, being flowed down and forming a plurality of hemispherical microlenses 110A.

However, the organic photoresist used for the microlens 110A is made of a fragile material. Thus, the microlens 110A may be prone to physical shocks causing damages to the microlens 110A, e.g., a crack denoted as 'A' in FIG. 2. Also, a defect might be generated by a contamination 'B' when the microlens 110A is exposed to a chemical which melts the organic material used in the microlens 110A. Furthermore, it is difficult to remove particles 'C' adsorbed onto the organic photoresist 110 due to a highly viscous material used in the organic photoresist 110. These adsorbed particles may block lights from transmitting through the array of microlenses, thereby generating black spots on a display device with the image sensor having the microlens.

SUMMARY OF THE INVENTION

It is, therefore, an object of the present invention to provide a method for fabricating an image sensor with an inorganic microlens capable of easily suppressing incidences of crack and contamination and of removing particles.

In accordance with an aspect of the present invention, there is provided a method for fabricating an inorganic microlens of an image sensor, including the steps of: depositing an inorganic layer on a substrate; forming a hemispherical photoresist pattern on the inorganic layer; and performing a blanket etch-back process to thereby form a hemispherical inorganic microlens.

BRIEF DESCRIPTION OF THE DRAWINGS

The above and other objects and features of the present invention will become better understood with regard to the following description of the preferred embodiments given in conjunction with the accompanying drawings, in which.

DETAILED DESCRIPTION OF THE INVENTION

Hereinafter, a preferred embodiment of the present invention will be described in detail with reference to the accompanying drawings.

Figure 1:
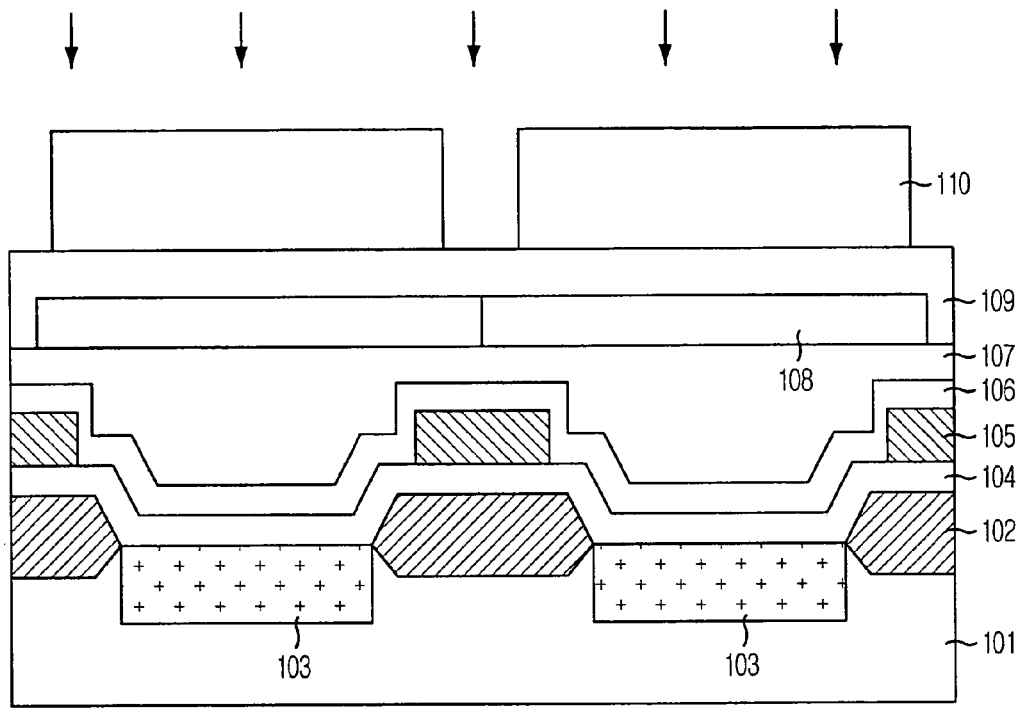
FIGS. 1 and 2 are diagrams illustrating a conventional method for fabricating a microlens.
Figure 2:
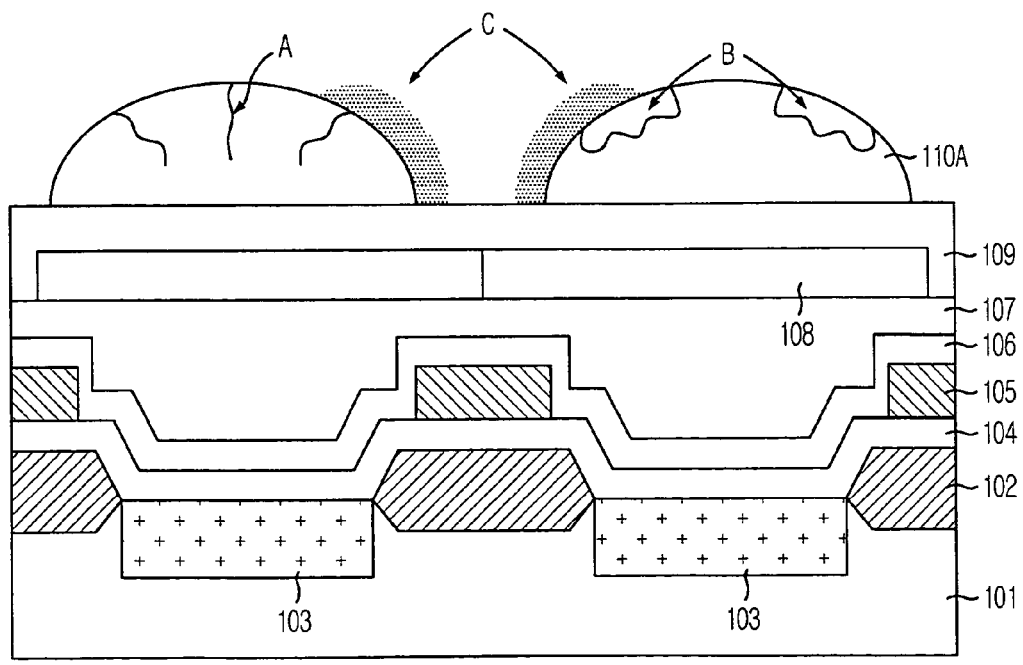
Figure 3:
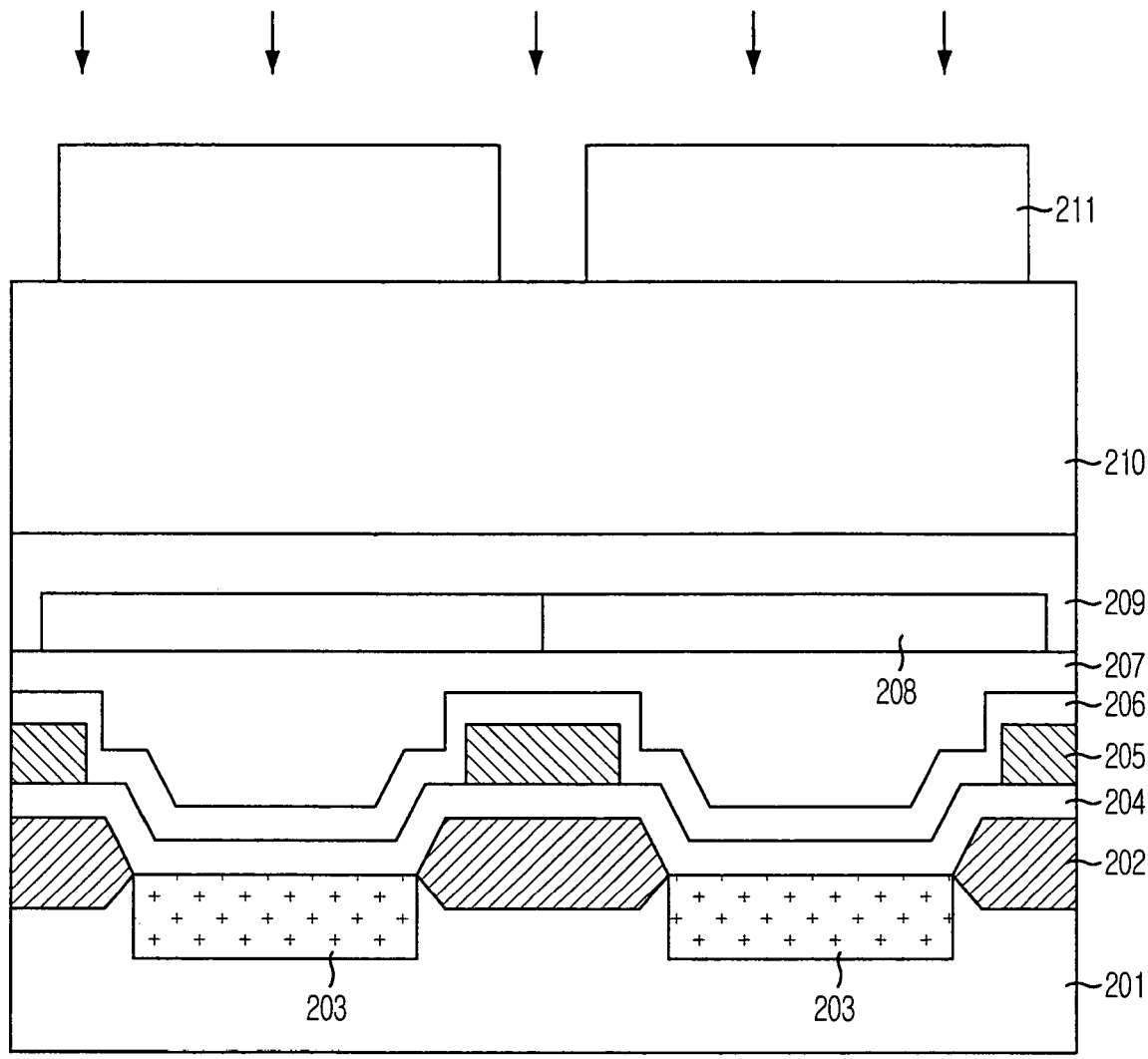
FIGS. 3 to 5 are cross-sectional views illustrating a method for fabricating an inorganic microlens in accordance with a preferred embodiment of the present invention.
Figure 4:
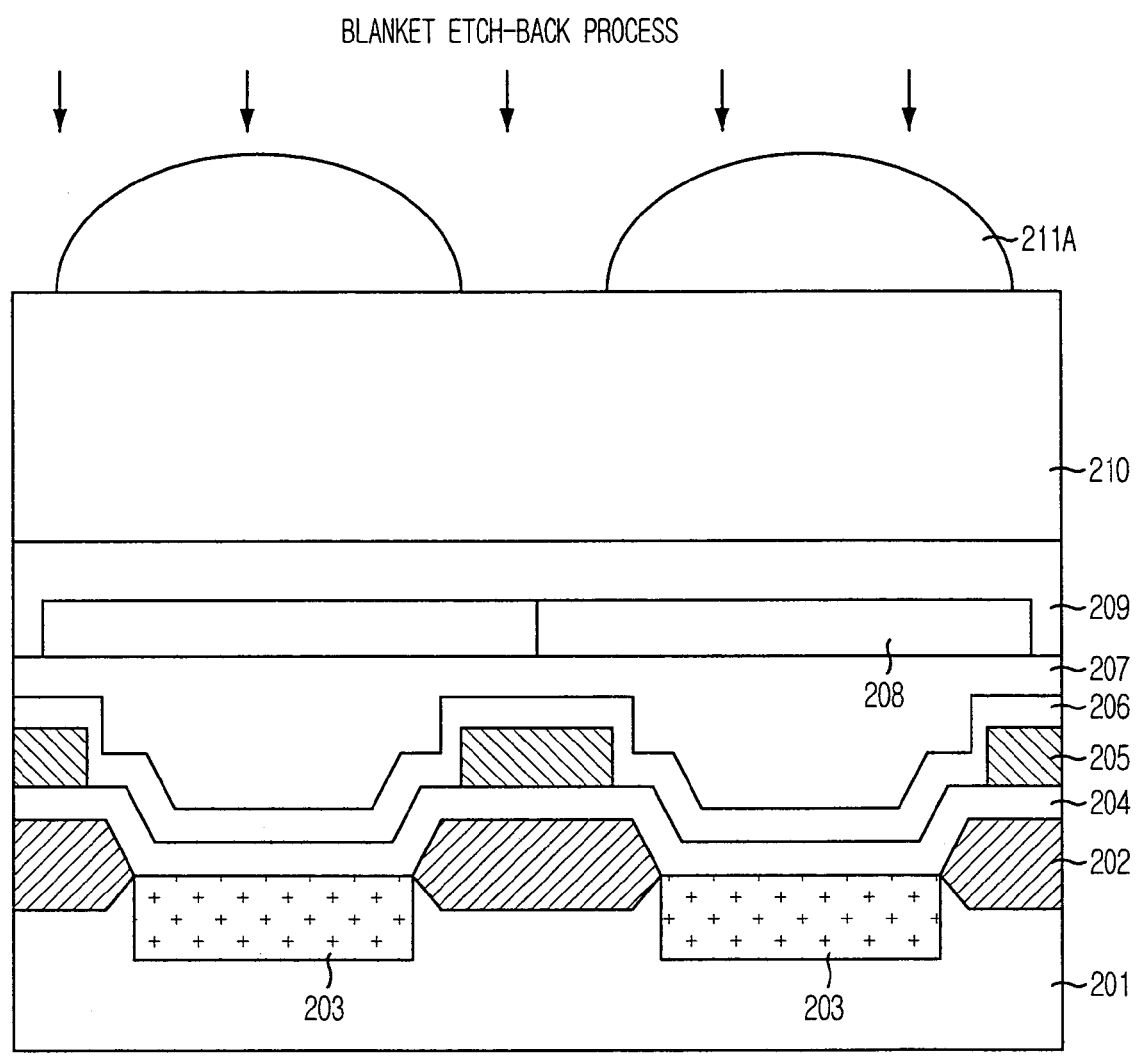
Figure 5:
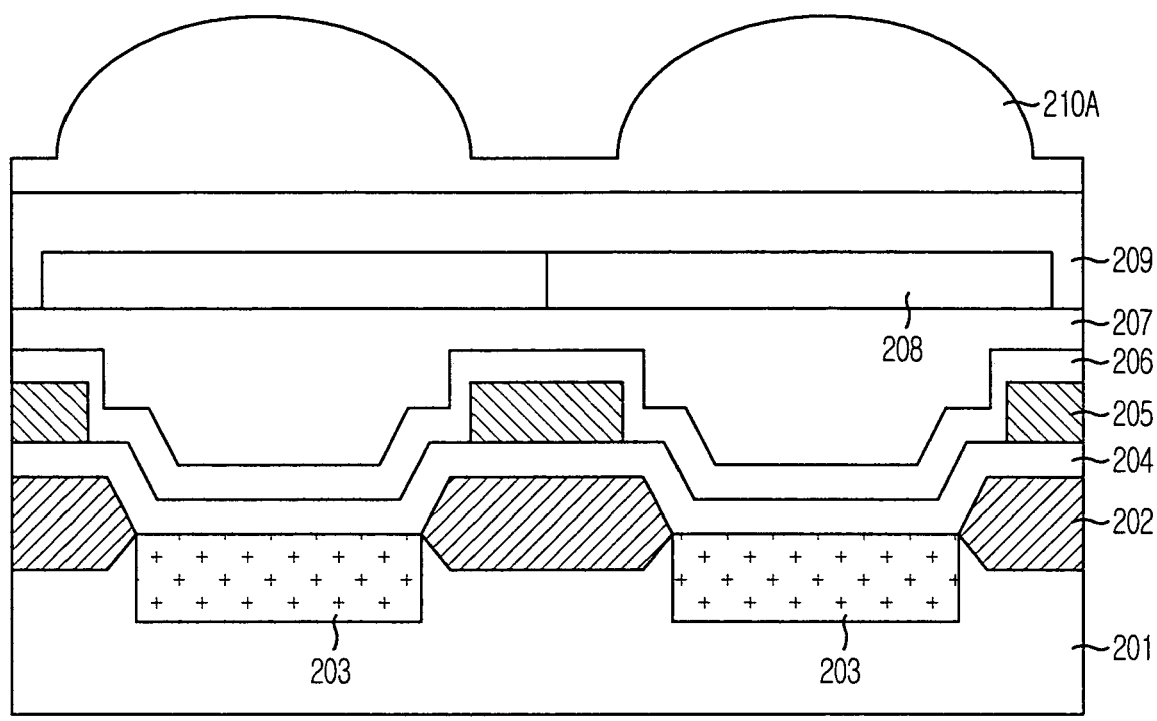

FIGS. 3 to 5 are cross-sectional views showing a method for fabricating an inorganic microlens in accordance with a preferred embodiment of the present invention.

Referring to FIG. 3, field oxide layers 202, photodiodes 203, an inter-metal insulation layer 204, metal wires 205 and a passivation layer 206 are sequentially formed on a silicon substrate 201. Then, a first planarization layer 207, color filters 208 and a second planarization layer 209 are sequentially formed on top of the above resulting structure.

Next, an array of inorganic microlenses is formed on the second planarization layer 209. More specifically, an inorganic oxide layer 210 is formed on the second planarization layer 209. An organic photoresist pattern 211 is then formed on a region of the inorganic oxide layer 210 corresponding to each photodiode 203. A thermal process is performed thereafter.

Herein, the organic photoresist pattern 211 is not used for forming the array of microlenses but for the purpose of an etch mask when the inorganic oxide layer 210 is subjected to an etching process. The inorganic oxide layer 210 is formed with a thickness ranging from about 5000 Å to about 30000 Å depending on a focal length of the microlenses and a size of the photodiode 203. Also, the inorganic oxide layer 210 is deposited at a low temperature ranging from about 100° C. to about 200° C. in order to prevent degradation of the color filters 208.

Referring to FIG. 4, after the thermal process, the organic photoresist pattern 211 becomes hemispherical. Hereinafter, the hemispherical organic photoresist pattern is denoted with a reference number 211A. Then, a blanket etch-back process is performed to the inorganic oxide layer 210 by using the hemispherical organic photoresist pattern 211A as an etch mask. At this time, the blanket etch-back process uses an etch gas of $CHF_3$ and $CF_4$ mixed in a ratio of about 2 to 1 and proceeds under condition that an etch selectivity between the organic photoresist 211 and the inorganic oxide layer 210 is almost about 1 to 1. However, the composition ratio of the above etch gas is variable depending on an employed equipment and material characteristics. Generally, an amount of the $CHF_3$ gas is higher than that of the $CF_4$ gas.

Referring to FIG. 5, the hemispherical organic photoresist pattern 211A is removed. After the blanket etch-back process, the inorganic oxide layer 210 is patterned as the same shape of the hemispherical organic photoresist pattern 211A, thereby obtaining an array of hemispherically patterned inorganic oxides 210A. Each of the hemispherically patterned inorganic oxides 210A serves as an inorganic microlens.

Meanwhile, if the organic photoresist pattern 211 is formed by performing a photolithography process along with the use of a conventional microlens mask, adjacent hemispherically patterned inorganic oxides 210A are not completely separated since each microlens should be maintained with an intended size. Also, this non-separated shape of the inorganic microlens 210A does not result in a functional defect in the microlens.

If these hemispherically patterned inorganic oxides 210A are needed to be separated, each of the hemispheres in the hemispherical organic photoresist pattern 211A is formed with a size bigger than an intended size of the microlens. Then, the inorganic oxide layer 210 is over-etched with use of the hemispheric organic photoresist pattern 211A as an etch mask to thereby form the completely separated hemispheric inorganic microlenses 210A each with the intended size.

Since the microlens fabricated in accordance with the preferred embodiment of the present invention is made of an inorganic material, it is possible to solve the problems of a crack generated by a physical shock, a contamination-related defect and a focusing difficulty created by particles remaining on the viscous organic microlens. As a result, it is further possible to improve yields of image sensors with enhanced competitiveness in current markets.

Although the above preferred embodiment exemplifies the use of oxide as the inorganic material for forming the microlens, such a nitride layer and an oxynitride layer can be still used as the inorganic material. Also, a thickness and a composition ratio of the nitride layer and oxynitride layer can be varied to control an index of refraction.

While the present invention has been described with respect to certain preferred embodiments, it will be apparent to those skilled in the art that various changes and modifications may be made without departing from the scope and spirit of the invention as defined in the following claims.

What is claimed is:

1. A method for fabricating an inorganic microlens of an image sensor, comprising:
   depositing an inorganic layer on a substrate;
   forming a hemispherical photoresist pattern on the inorganic layer wherein the photoresist pattern is an organic layer; and
   performing a blanket etch-back process using the hemispherical photoresist pattern to form a hemispherical inorganic microlens.

2. The method of claim 1, wherein the blanket etch-back process provides substantially the same etch selectivity between the hemispherical photoresist pattern and the inorganic layer.

3. The method of claim 1, wherein the inorganic layer is made of a material selected from a group consisting of oxide, nitride and oxynitride.

4. The method of claim 1, wherein the hemispherical photoresist pattern is formed with a size as big as an intended size of the microlens and the inorganic layer is etched by performing the blanket etch-back process until reaching a predetermined size substantially equal to the size of the hemispherical photoresist pattern.

5. The method of claim 1, wherein the hemispherical photoresist pattern is formed with a bigger size than an intended size of the microlens and the inorganic layer is over-etched by performing the blanket etch-back process to form the individually separated microlens with the intended size.

6. The method of claim 1, wherein the inorganic layer is deposited at a temperature ranging from about 100° C. to about 200° C. to prevent degradation of a color filter formed on the substrate.

7. The method of claim 1, wherein the inorganic layer is deposited to a thickness ranging from about 5000 Å to about 30000 Å depending on a focal length and a size of a light capturing device formed on the substrate.

8. The method of claim 1, wherein the forming the hemispherical photoresist pattern on the inorganic layer includes:
   forming a photoresist pattern on the inorganic layer through a photolithography; and
   performing a thermal process for flowing the photoresist pattern down to make the photoresist pattern hemispheric.

9. The method of claim 1, wherein the blanket etch-back process employs an etch gas of $CHF_3$ and $CF_4$ and an amount of the $CHF_3$ gas is greater than that of the $CF_4$ gas.

* * * * *